US005484749A

United States Patent [19]
Maeda et al.

[11] Patent Number: 5,484,749
[45] Date of Patent: Jan. 16, 1996

[54] MANUFACTURING METHOD OF SEMICONDUCTOR DEVICE

[75] Inventors: Kazuo Maeda; Noboru Tokumasu; Yuko Nishimoto, all of Tokyo, Japan

[73] Assignees: Alcan-Tech Co., Inc.; Semiconductor Process Laboratory Co., Ltd.; Canon Sales Co., Inc., all of, Japan

[21] Appl. No.: 416,488

[22] Filed: Apr. 4, 1995

Related U.S. Application Data

[63] Continuation of Ser. No. 37,472, Mar. 25, 1993, abandoned, which is a continuation of Ser. No. 742,256, Aug. 8, 1991, abandoned.

[30] Foreign Application Priority Data

Aug. 10, 1990 [JP] Japan ................................ 2-213343

[51] Int. Cl.$^6$ .................................................. H01L 21/02
[52] U.S. Cl. ................................. 437/238; 437/240
[58] Field of Search ..................................... 437/238, 240

[56] References Cited

U.S. PATENT DOCUMENTS

| 4,056,642 | 11/1977 | Saxena et al. | 427/84 |
|---|---|---|---|
| 4,361,461 | 11/1982 | Chang | 204/192.32 |
| 4,590,091 | 5/1986 | Rogers, Jr. et al. | 437/173 |
| 4,708,884 | 11/1987 | Chandross et al. | 427/39 |
| 4,845,054 | 7/1989 | Mitchener | 437/238 |
| 4,872,947 | 10/1989 | Wang et al. | 156/643 |
| 4,980,307 | 12/1990 | Ito et al. | 437/40 |
| 4,985,372 | 1/1991 | Narita | 437/200 |
| 5,063,081 | 11/1991 | Cozzette et al. | 427/2 |

FOREIGN PATENT DOCUMENTS

| 0421203 | 9/1990 | European Pat. Off. |
|---|---|---|
| 0436185 | 12/1990 | European Pat. Off. |
| 0113335 | 9/1980 | Japan |
| 96655 | 4/1988 | Japan |

OTHER PUBLICATIONS

Wolf, Silicon Processing for the VLSI Era, vol. 1, Lattice Press, 1986, pp. 182–190.
Fujino et al, "Surface Modification of Base Materials for TEOS/$O_3$ . . . ," Reprinted from J. of Electrochemical Society V. 139, No. 6 (Jun. 1992).
Butherus, A., $O_2$ plasma-converted spin-on-glass for planarization, J. Vac. Sci. Tech. B3(5), Oct. 1985, pp. 1352–1356.

*Primary Examiner*—R. Bruce Breneman
*Assistant Examiner*—Linda J. Fleck
*Attorney, Agent, or Firm*—Lorusso & Loud

[57] ABSTRACT

The present invention provides a method of manufacturing a semiconductor device, characterized in that, after a surface of a substrate is reformed by high frequency plasma irradiation while the substrate is heated, an organic silane and ozone are reacted to form a silicon oxide film on the substrate under normal pressure or reduced pressure. The present invention also provides a method of manufacturing a semiconductor device, characterized in that, after a surface of a substrate is reformed by high frequency plasma irradiation while heating the substrate, organic silane, gas containing dopants such as phosphorus or boron and ozone are mixed, and a PSG film, a BSG film, a BPSG film or the like is formed on the substrate under normal pressure or reduced pressure.

9 Claims, 8 Drawing Sheets

MANUFACTURING METHOD OF SEMICONDUCTOR DEVICE

This application is a continuation of application No. 08/037,472, filed Mar. 25, 1993, now abandoned, which is a continuation of application No. 07/742,256, filed Aug. 8, 1991, now abandoned.

BACKGROUND OF THE INVENTION

The present invention relates to a method of manufacturing semiconductor device, and more particularly to a method of manufacturing a semiconductor device by forming a silicon oxide film and a PSG film, a BSG film, or a BPSG film and the like by mixing organic silane and ozone, or gas containing an impurity such as phosphorus or boron.

The inventors of the present application had previously found that a $SiO_2$ film formed by a TEOS-$O_3$ reaction has advantages such as excellent step coverage and that very few articles are generated during film formation. The present inventors had also found that characteristics of the film depend on the $O_3$ concentration, and that the following advantages are obtainable as the $O_3$ concentration gets higher.

(1) Increase of film forming speed
(2) Increase of film density
(3) Reduction of etching rate
(4) Reduction of leakage current
(5) Reduction of —OH, $H_2O$ components in the film
(6) Improvement of crack resistance
(7) Reduction of stress
(8) Improvement of step coverage (Flow configuration)

On the other hand, however, the TEOS-$O_3$ reaction being a surface reaction, the reaction is very sensitive to the substrate surface on which the film is formed, and the characteristics of formed films sometimes differ when substrate films are different.

Figure 7A:
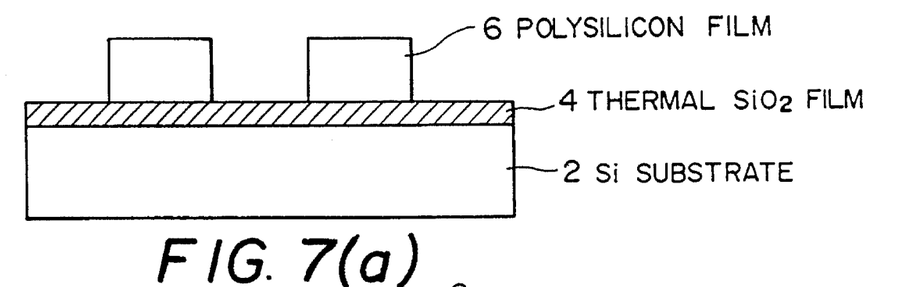
FIGS. 7(a), 7(b) and 7(c) are schematic views illustrating a conventional manufacturing method.
Figure 7B:
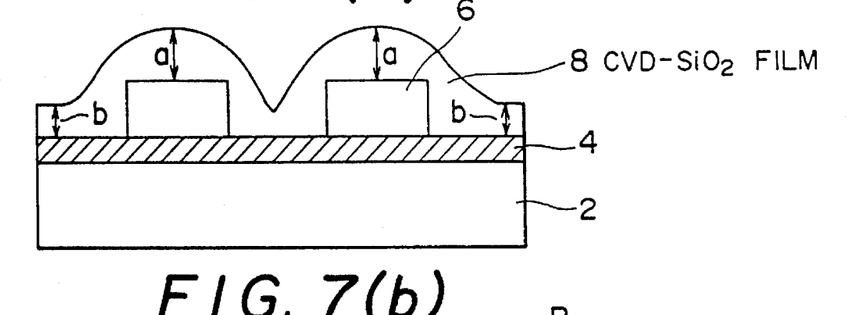
Figure 7C:
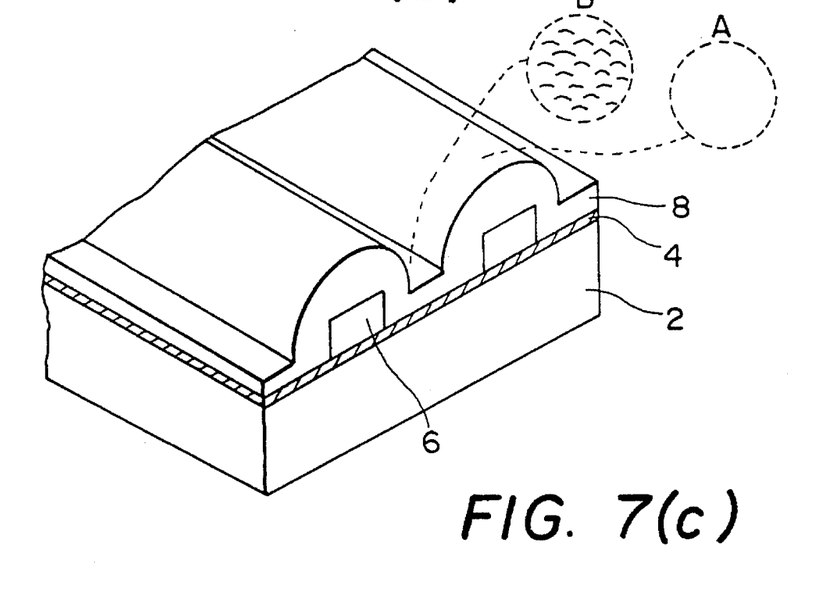

FIGS. 7(a), 7(b) and 7(c) show a method of forming a CVD-$SiO_2$ film by a Tetra-Ethyl-Ortho-Silicate (TEOS, $Si(OC_2H_5)_4$)—$O_3$ reaction according to a conventional technique.

In FIG. 7(a), reference numeral 4 denotes a thermal $SiO_2$ film formed on a surface of a Si substrate 2, and 6 denotes a polycrystalline silicon film (hereinafter referred to in brief as a "poly-Si film") formed on the thermal $SiO_2$ film 4. Examples of semiconductor devices having such a structure include a MOS transistor comprising the thermal $SiO_2$ film 4 as a gate $SiO_2$ film and the poly-Si film 6 as a gate electrode.

Next, a CVD-$SiO_2$ film 8 is formed as an interlayer insulating film by the TEOS-$O_3$ reaction as shown in FIG. 7(b).

It has now been found that the surface of the CVD-$SiO_2$ film formed by the TEOS-$O_3$ reaction is even (see partially enlarged view A) where the backing is the poly-Si film 6 as shown in a perspective view of FIG. 7(c), but that unevenness is sometimes produced on the film surface (see a partially enlarged view B) when the backing is a thermal $SiO_2$ film 4.

Figure 8:
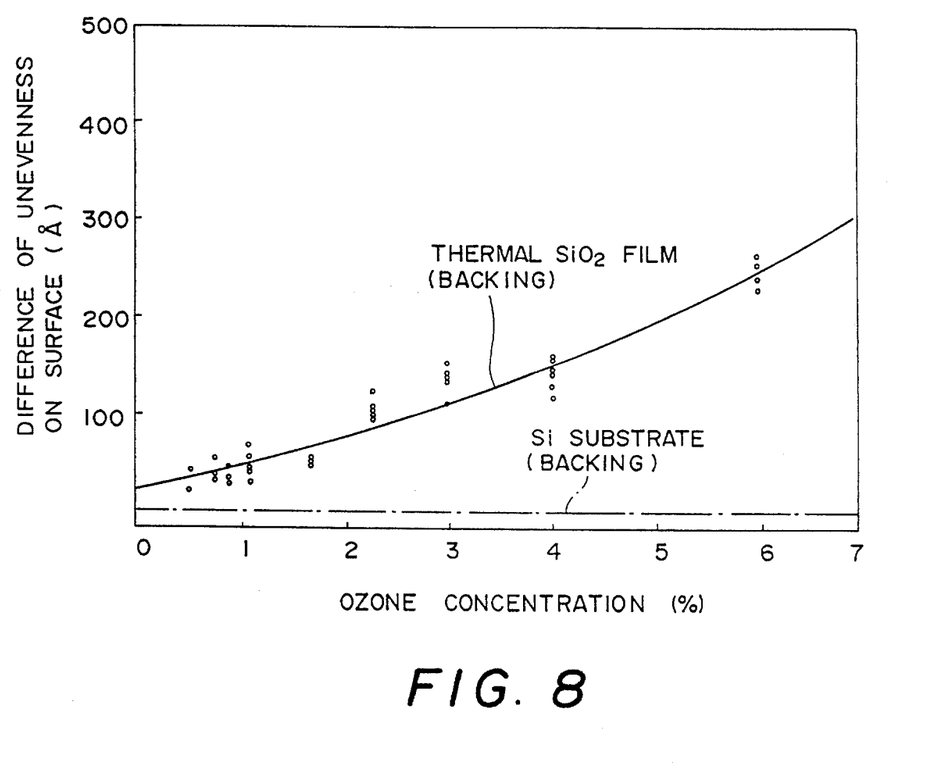
FIG. 8 is a graph of surface unevenness of a CVD-$SiO_2$ film formed according to a conventional manufacturing method.

FIG. 8 is a diagram showing measurements of unevenness of the surface of the CVD-$SiO_2$ film formed using such a conventional method by the present inventors. In FIG. 8, the abscissa shows ozone concentration (%), the ordinate shows the difference in unevenness on the surface of the CVD-$SiO_2$ film (Å), for two different backings (thermal $SiO_2$ film and Si film). In such a manner, an even CVD-$SiO_2$ film surface is obtainable regardless of the $O_3$ concentration when the backing is Si, but the smoothness of the film surface is dependent upon the $O_3$ concentration when the backing is a thermal $SiO_2$ film, and there is the tendency that the unevenness of the CVD-$SiO_2$ film surface becomes greater as the $O_3$ concentration gets higher.

The unevenness was measured by applying a probe to the surface of the $SiO_2$ film and measuring the distance of vertical movement thereof.

Figure 9:
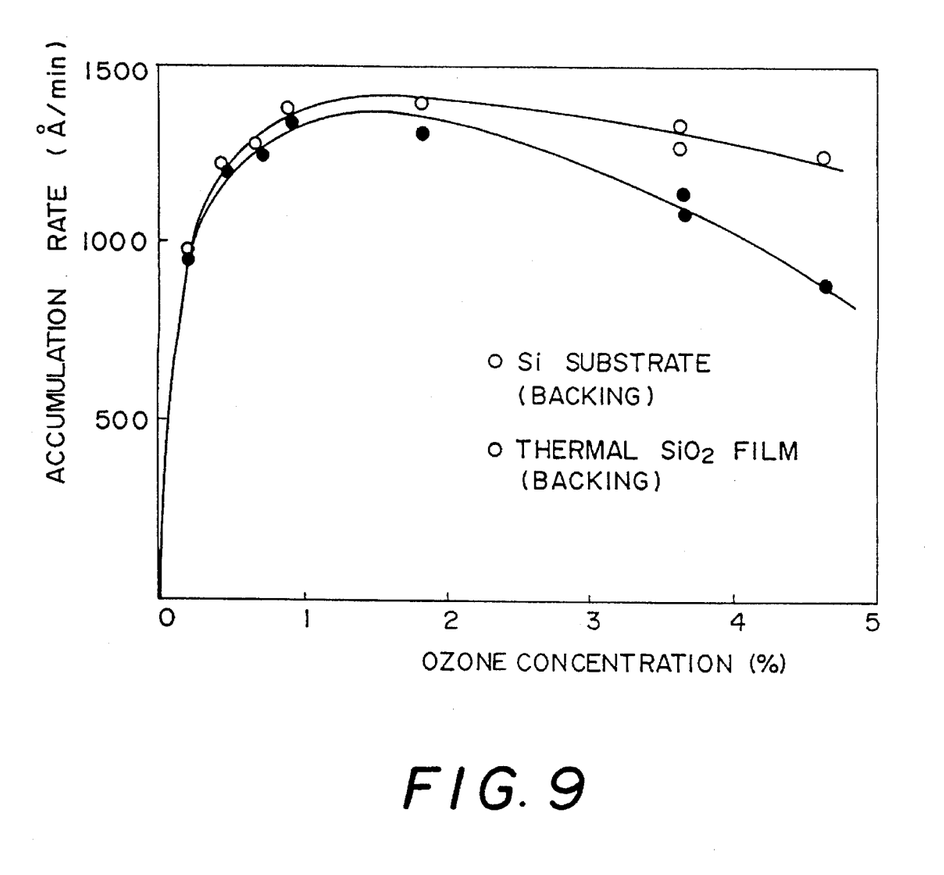
FIG. 9 is a graph of rate of accumulation rate of a CVD-$SiO_2$ film formed according to a conventional manufacturing method.

FIG. 9 is a diagram showing the results of measurement of formation rate of the CVD-$SiO_2$ film, formed by using the same conventional method as that used in FIG. 8. As shown in the Figure, control is easy in manufacturing since dependency of the formation rate on the $O_3$ concentration is small when the $O_3$ concentration reaches approximately 1% or more, where the backing is of Si, but the formation rate depends greatly on the $O_3$ concentration when the backing is a $SiO_2$ film, and the formation rate is lowered as the $O_3$ concentration gets higher. Thus, there is the problem in manufacturing of control of film thickness.

When the $O_3$ concentration is lowered (to approximately 3% or lower), the film quality of the CVD-$SiO_2$ film is not sufficient, and the step coverage at a step portion changes from a flow configuration to an isotropy, which, therefore, presents difficulty when the CVD-$SiO_2$ film is used as an interlayer insulating film.

As described above, a conventional method presents a dilemma that the film quality is good but subject to serious influence by the backing when the $O_3$ concentration is high. On the other hand, however, the film quality is less affected by the backing but the film quality is diminished when the $O_3$ concentration is low. Thus, it is difficult to solve all the problems at the same time by use of a specific $O_3$ concentration.

SUMMARY OF THE INVENTION

It is an object of the present invention to provide a method manufacturing a semiconductor device involving formation of a CVD film such as a $SiO_2$ film or a BPSG film in which generation of unevenness on the film surface is controlled and the CVD film has a stabilized formation rate and good film quality.

The method of manufacturing a semiconductor device of the present invention is characterized in that, after applying high frequency plasma irradiation processing to a surface of a substrate while heating the same so as to reform the substrate surface, organic silane and ozone are mixed and a silicon oxide film or a like is formed on the substrate under atmospheric pressure or reduced pressure.

When the inventors of the present application perceived the fact that the characteristics of such a film depend on the state of the surface of the substrate, since the organic silane (such as TEOS)—$O_3$ reaction is a surface reaction, and tried various methods of surface treatment, it was found that plasma processing was the best.

Figure 1A:
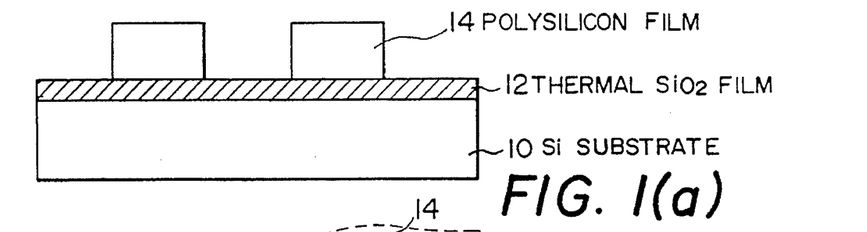
FIGS. 1(a), 1(b) and 1(c) are schematic views in cross-section illustrating a method of manufacturing a semiconductor device according to an embodiment of the present invention.
Figure 1B:
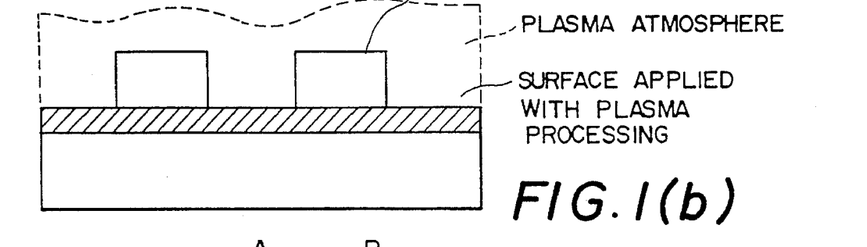

For example, when organic silane (TEOS) and ozone $O_3$ are mixed and a silicon oxide film (CVD-$SiO_2$ film 16) is formed on a substrate under atmospheric pressure or reduced pressure, after reforming the surface of the substrate (thermal $SiO_2$ film 12) FIG. 1(b)) by applying high frequency plasma irradiation processing with heating of the substrate (a Si substrate 10) as illustrated in FIG. 1, film thickness b of a $SiO_2$ film accumulated on the thermal $SiO_2$ film 12 becomes equal to a film thickness a of a $SiO_2$ film accumulated on the poly-Si film 12 (a=b), and the unevenness on the surface also disappears, thus solving the conventional problems.

This phenomenon is conjectured to have occurred due to the fact that the surface of the thermal $SiO_2$ film 12 has been reformed from hydrophilic to hydrophobic by the plasma irradiation processing.

Figure 2:
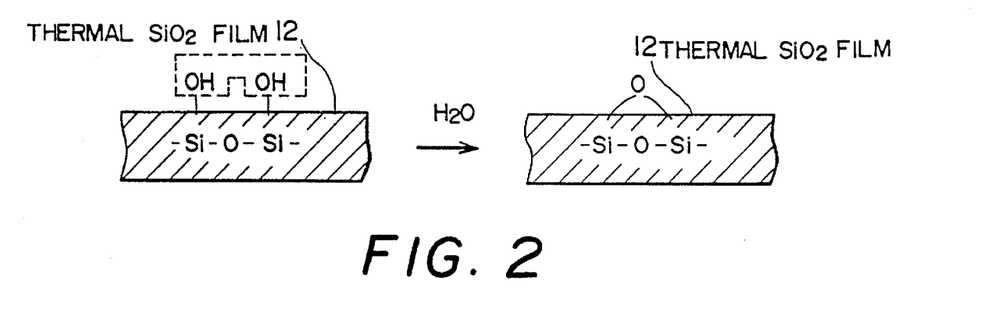
FIG. 2 is a schematic diagram explaining the operation of the present invention.

FIG. 2 shows this phenomenon schematically. Namely, the surface of the thermal $SiO_2$ film is hydrophilic before plasma processing because of existence of —OH radicals, but it is conjectured that the surface has been reformed as shown in the Figure because of the fact that the Si—OH coupling is broken by means of plasma processing. It can be confirmed that the hydrophilic property has been changed to a hydrophobic property by measuring and comparing the contact angle of water at the surface of the thermal $SiO_2$ film before and after plasma processing.

The high frequency used in plasma processing is at 13.56 MHz in general, but may be at 100 to 200 KHz. However, since surface reformation is the object, it is required to set the amplitude of the electric power to avoid film formation and etching of the substrate.

Further, activating gas of Ar, He, $N_2$ or $O_2$ is appropriate.

Furthermore, the present invention is applicable not only to a case in which the combination of the backing illustrated in FIG. 1 is a poly-Si film, but also to cases of the following combinations of the backing.

Al-BPSG, PSG, thermal $SiO_2$
W-BPSG, PSG, thermal $SiO_2$
$WSi_x$-BPSG, PSG, thermal $SiO_2$
Al-BPSG, PSG, thermal $SiO_2$
Poly-Si-BPSG, PSG, thermal $SiO_2$

DESCRIPTION OF THE PREFERRED EMBODIMENTS

Figure 1C:
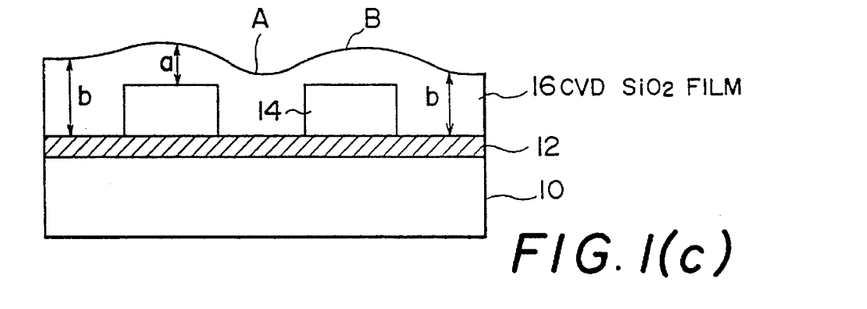

FIGS. 1(a), 1(b) and 1(c) illustrate a CVD method of forming a $SiO_2$ film utilizing a TEOS-$O_3$ reaction according to an embodiment of the present invention, in which a numeral 12 denotes a thermal $SiO_2$ film formed on a surface of a Si substrate 10 by means of thermal processing, and 14 denotes a poly-Si film formed over the thermal $SiO_2$ film 12. For example, a MOS transistor including a thermal $SiO_2$ film 12 as a gate $SiO_2$ film and a poly-Si film 14 as a gate electrode has such a structure.

Figure 3A:
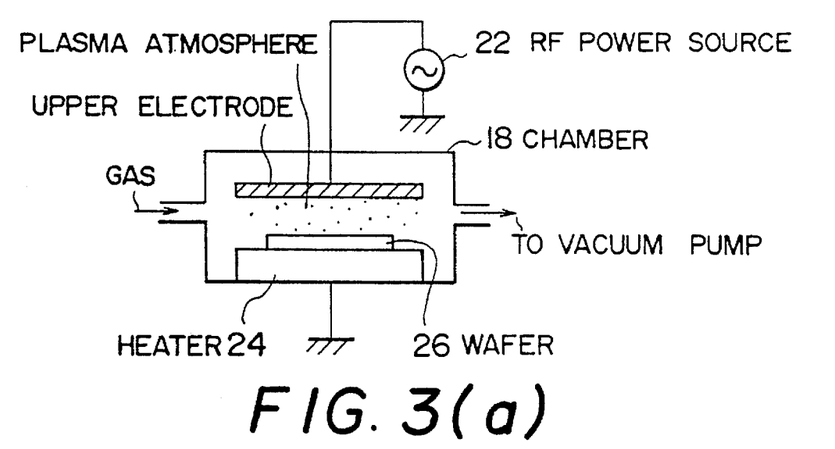
FIGS. 3(a) and 3(b) are schematic diagrams of plasma surface processing apparatus suitable for use in embodiments of the present invention.

When the Si substrate 10 is placed in a plasma surface processing apparatus shown in FIG. 3(a) and exposed to a plasma atmosphere of $N_2$ gas, the Si—OH bonds on the surface of the thermal $SiO_2$ film 12 are broken and the surface is reformed (see FIG. 1 (b)) as shown in the schematic diagram of FIG. 2.

An RF plasma apparatus having a parallel plate anode coupling system, as shown in FIG. 3(a), may be used for the plasma processing.

In FIG. 3(a), 18 denotes a chamber, 20 denotes an upper electrode supplied with high frequency electric power from an RF power source 22, and 24 denotes a heater which heats a wafer 26.

When plasma processing is performed, the wafer 26 is placed on a susceptor (heater 24) in the chamber 18 and heated to approximately 350°, for example, and then $N_2$ gas is introduced therein, and high frequency electric power at 200 W and 13.56 MHz is applied to the upper electrode 20, thereby converting the $N_2$ gas into a plasma state. Approximately one minute will suffice for the plasma processing time.

Figure 3B:
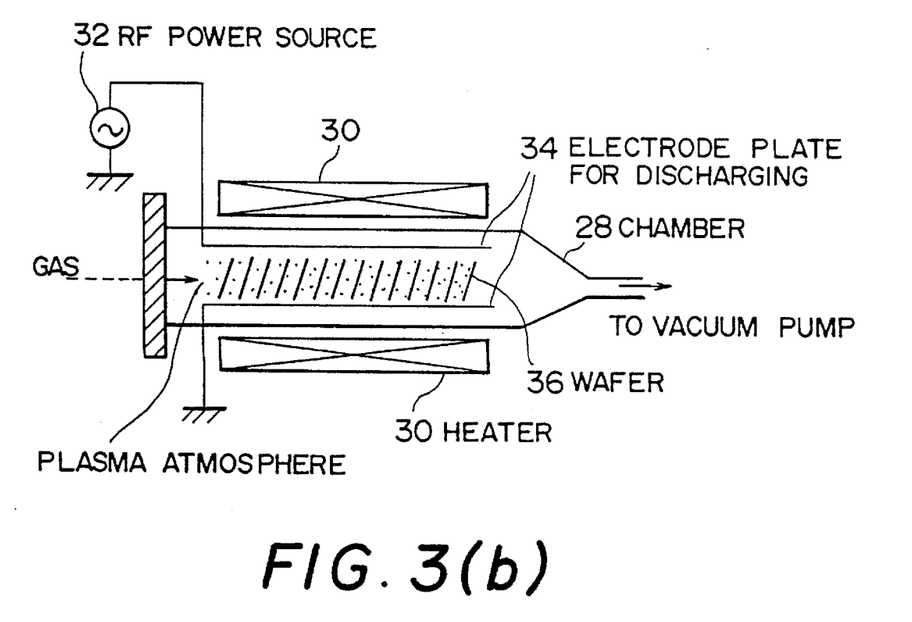

A batch type RF plasma processing apparatus having a discharge coil in a tubular furnace, as shown in FIG. 3(b), may be used as the plasma processing apparatus. In FIG. 3(b), 28 denotes a chamber, 30 denotes a heater, 32 denotes an RF power source, 34 denotes discharge electrode plates, and 36 denotes a wafer which is to be processed.

Next, a CVD-$SiO_2$ film, formed by the TEOS-$O_3$ reaction, is accumulated on a surface of a substrate reformed by plasma processing in the second process as shown in FIG. 1(c). For example, the temperature of the substrate is set at 400° C., the TEOS source temperature is set to 65° C. (saturated vapor pressure at 20 mmHg), the $O_3$ concentration is set to 5%, the flow rate of the carrier gas $N_2$ is set to 3.5 SLM and processing is performed for 7 to 8 minutes using a CVD film forming apparatus such as shown in FIG. 4.

In the above manner, a $SiO_2$ film having a film thickness of approximately 1 μm is formed, but the film thickness b of the CVD-$SiO_2$ film formed on the thermal $SiO_2$ film 12 and the film thickness a of the CVD-$SiO_2$ film formed on the poly-Si film 14 become equal to each other (a=b) at that timed and the unevenness on surface A of the CVD-$SiO_2$ film on the thermal $SiO_2$ film 12 disappears to become smooth similar to a surface B of the CVD-$SiO_2$ film on the poly-Si film 14. Further, coverage of above-mentioned CVD-$SiO_2$ film over steps on the poly-Si film was also excellent.

Figure 4:
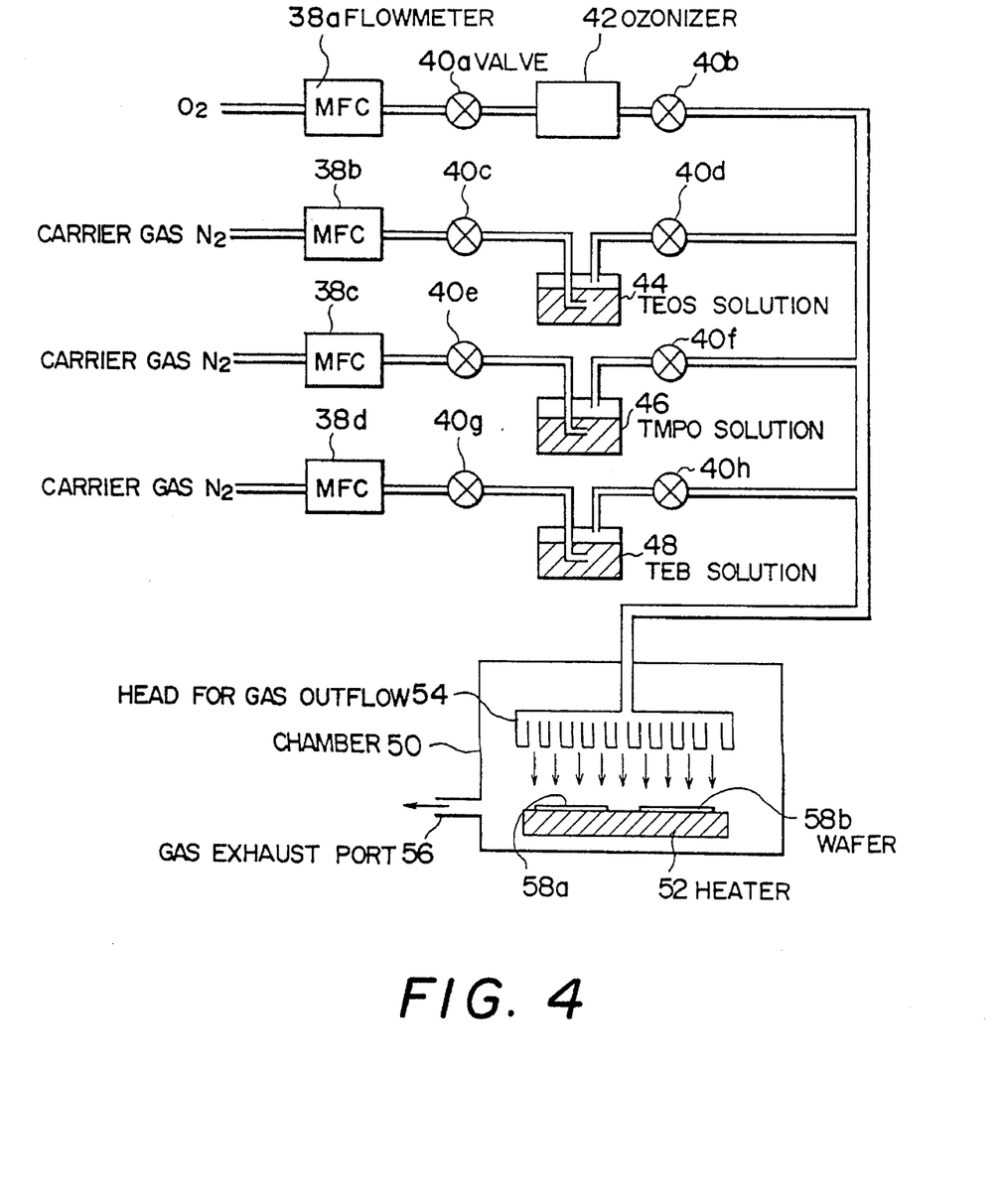
FIG. 4 is a schematic block diagram of a CVD film forming apparatus suitable for use in an embodiment of the present invention.

FIG. 4 is a schematic block diagram of a CVD film forming apparatus which may be used in a manufacturing method according to an embodiment of the present invention. In FIG. 4, 38a to 38d denote flowmeters (MFC), 40a to 40h denote valves, 42 denotes an ozonizer which changes oxygen ($O_2$) into ozone ($O_3$), 44 denotes a TEOS solution which is at a temperature of 40° to 65° C., 46 denotes a tri-methyl phosphate (TMPO) solution which is at 50° to 60° C., and 48 denotes a tri-ethyl borate (TEB) solution which is at 5° to 50° C.

Further, 50 denotes a chamber, 52 denotes a heater, 54 denotes a head for emitting gas, 56 denotes a gas exhaust port, and 58a and 58b denote wafers which serve as substrates for film formation.

When a SiO$_2$ film is formed, the valves 40a to 40d are opened in the manufacturing apparatus shown in FIG. 4. O$_3$ gas coming out of the ozonizer 42 and TEOS gas emitted with carrier gas N$_2$ are supplied into the chamber 50 from the head 54, the TEOS gas is decomposed by O$_3$ on the wafers 58a and 58b, and a CVD-SiO$_2$ film is thereby formed on the surfaces of the wafers.

The O$_3$ concentration is changed by adjusting the degree of O$_2$–O$_3$ conversion in the ozonizer 42 or by regulating flow using flowmeter MFC 38a and a valve 40a or 40b.

Further, when a PSG film, a BSG film or a BPSG film and/or the like is substituted for the SiO$_2$ film, they may be formed by opening and closing the appropriate valves 40a to 40h.

Furthermore, while a CVD film formed by the TEOS-O$_3$ reaction has been described in the embodiment, the present invention is also applicable to a film formed by a reaction between another alkoxysilane or siloxane compound (for example, polysiloxane (Octa-Methyl-Cyclo-Tetra-Siloxane and the like) and O$_3$.

Figure 5:
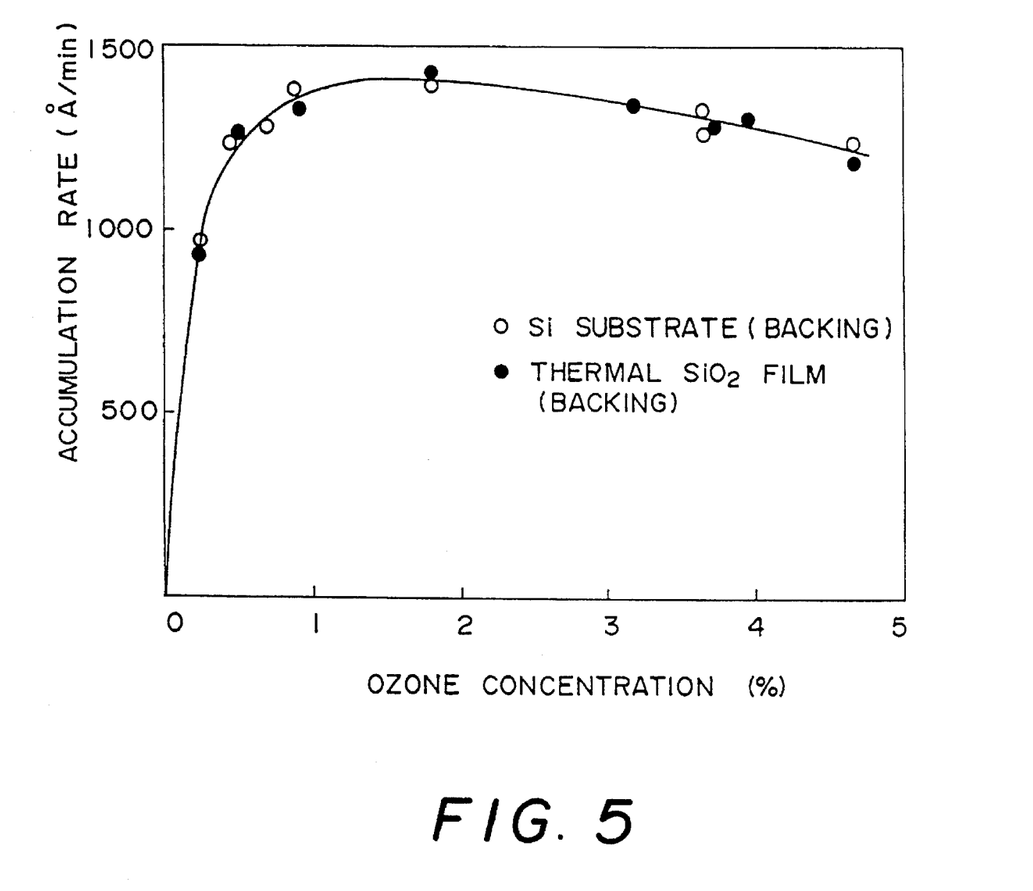
FIG. 5 is a graph of rate of accumulation of a CVD-$SiO_2$ film according to the method of manufacturing of the present invention.

FIG. 5 is a graph showing the rate of accumulation when a SiO$_2$ film is formed by the TEOS-O$_3$ reaction on a Si substrate having a hydrophobic surface and the rate of accumulation when a SiO$_2$ film is formed by the TEOS-O$_3$ reaction on a substrate of a thermal SiO$_2$ film having had its hydrophilic surface reformed into a hydrophobic surface through plasma processing. The abscissa shows the O$_3$ concentration, the ordinate shows the rate of accumulation, with a substrate temperature at 400° C. and the TEOS source temperature at 65° C.

As shown in the Figure, the rate of accumulation of the SiO$_2$ film on the thermal SiO$_2$ film becomes almost equal to the rate of accumulation of the SiO$_2$ film on the Si substrate, regardless of the O$_3$ concentration, thus making it possible to solve the conventional problems. On the contrary, according to a conventional method in which plasma reforming is not performed, the rate of accumulation of the CVD-SiO$_2$ film on the thermal SiO$_2$ film shows a larger difference, as compared to the rate of accumulation of the CVD-SiO$_2$ film on the poly-Si film, as the O$_3$ concentration gets higher (see FIG. 8).

Figure 6:
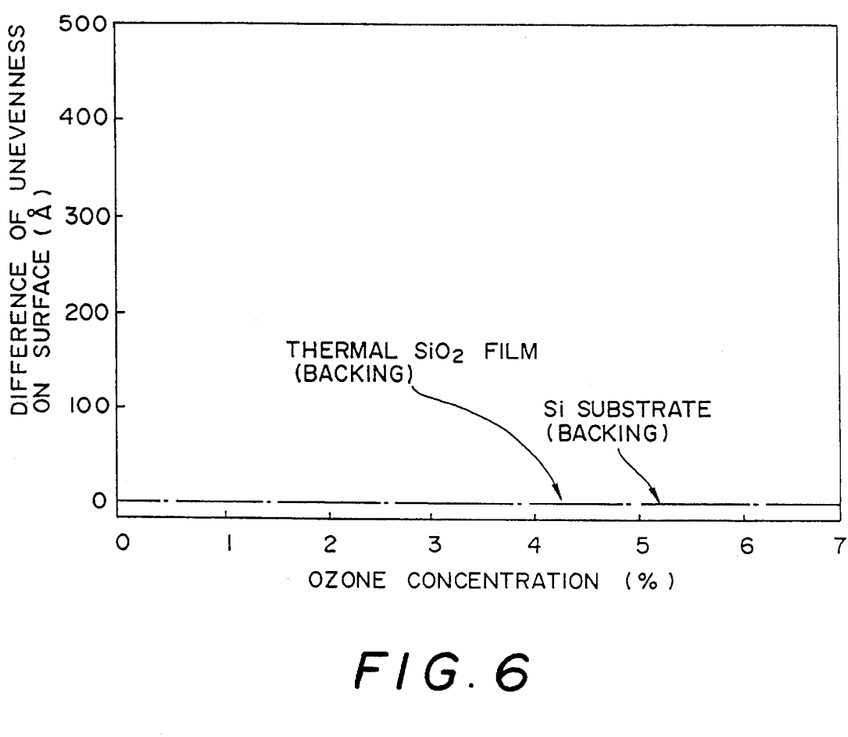
FIG. 6 is a graph of surface unevenness of a CVD-$SiO_2$ film according to the method of manufacturing of the present invention.

FIG. 6 is a graph of (1) the measured unevenness of a SiO$_2$ film when the SiO$_2$ film is formed by the TEOS-O$_3$ reaction on a Si substrate having a hydrophobic surface and (2) the measured unevenness of a surface of a SiO$_2$ film when the SiO$_2$ film is formed by the TEOS-O$_3$ reaction on a thermal SiO$_2$ film which has had its hydrophilic surface reformed into a hydrophobic surface through plasma processing. The abscissa shows the O$_3$ concentration, the ordinate shows the accumulation rate, with a substrate temperature at 400° C. and a TEOS source temperature at 65° C.

As shown in FIG. 6, unevenness does not appear on the surface of the SiO$_2$ film of the CVD-SiO$_2$ film formed on the thermal SiO$_2$ film after plasma processing even when the O$_3$ concentration becomes high. Moreover, unevenness does not appear, regardless of the O$_3$ concentration, on the surface of the CVD-SiO$_2$ film formed on a poly-Si film. On the contrary, with a conventional method in which plasma processing is not performed, the unevenness on the surface of the CVD-SiO$_2$ film on the thermal SiO$_2$ film becomes greater as the O$_3$ concentration is increased (see FIG. 9).

As described above, according to the present invention, it is possible to form a film having constant film thickness with no unevenness on the substrate, while obtaining a SiO$_2$ film of high quality by the TEOS-high concentration O$_3$ reaction and eliminating the influence of the backing film, by a simple method wherein plasma processing is performed, prior to CVD-SiO$_2$ film formation by reaction of an organic silane and O$_3$, to reform the surface of the substrate. Hence, the invention is very effectual when applied to formation of an interlayer insulating film of a semiconductor device such as a VLSI.

Table 1 shows the effect of plasma processing according to an embodiment of the present invention. The plasma processing was performed with N$_2$ gas, a high frequency power source at 13.56 MHz, electric power at 200 W and a degree of vacuum of 1 Torr, and the CVD-SiO$_2$ film formed with a substrate temperature at 400° C. and a O$_3$ concentration at 5%.

The results have been evaluated using, as criteria, the magnitude of the difference between (1) the accumulation rate of the CVD-SiO$_2$ film on the thermal SiO$_2$ film and (2) the accumulation rate of the CVD-SiO$_2$ film on Si, and the magnitude of the unevenness of the surface of the CVD-SiO$_2$ film. In the table, a mark ○ shows good compliance with those criteria, a mark Δ shows compliance to some extent, and a mark x shows poor compliance.

TABLE 1

| Substrate Temperature (°C.) | Processing Time (minutes) | | | | |
|---|---|---|---|---|---|
| | 1 min. | 5 min. | 10 min. | 30 min. | 60 min. |
| Room Temperature | x | x | x | x | x |
| 100° C. | x | x | x | x | x |
| 150° C. | x | x | x | Δ | Δ |
| 200° C. | x | x | Δ | Δ | ○ |
| 250° C. | Δ | Δ | ○ | ○ | ○ |
| 300° C. | ○ | ○ | ○ | ○ | ○ |
| 350° C. | ○ | ○ | ○ | ○ | ○ |
| 400° C. | ○ | ○ | ○ | ○ | ○ |

The experimental results indicate that it is possible to reform the surface with processing in a plasma of N$_2$ gas for approximately one minute when the substrate temperature is 350° C.

As described above, according to the manufacturing method of the present invention, it is possible to form a film having an even film thickness and no surface unevenness on a backing film. Further a film of high quality is formed even with a high concentration of O$_3$ in the reaction and the influence of the backing film is eliminated by a simple method utilizing plasma processing, prior to formation of a CVD-SiO$_2$ film, to reform the surface of the substrate. Accordingly, the present invention is very effective when applied to formation of a submicron interlayer insulating film of a semiconductor device, such as a VLSI having a multi-layer structure.

What is claimed is:

1. A method of manufacturing a semiconductor device comprising the steps of:

(a) providing a substrate having a surface, a portion of said surface being an exposed portion of a layer of hydrophilic thermally oxidized silicon;

(b) contacting the substrate surface with a high frequency nitrogen plasma at 150° to 400° C. to convert the exposed portion of said layer of hydrophilic thermally oxidized silicon from hydrophilic SiO$_2$ to hydrophobic SiO$_2$; and (c) reacting a gaseous mixture containing an organic silane and ozone to deposit an insulating film having a smooth surface over the substrate surface by CVD.

2. A method of manufacturing a semiconductor device according to claim 1, wherein the substrate comprises the hydrophilic thermally oxidized silicon layer on a silicon layer and a discontinuous layer of poly-Si partially covering the surface of said hydrophilic thermally oxidized silicon layer.

3. A method of manufacturing a semiconductor device according to claim 1, wherein the insulating film is a film selected from the group consisting of $SiO_2$, PSG, BSG and BPSG films.

4. A method of manufacturing a semiconductor device according to claim 1 further comprising regulating the amplitude of electric power forming the plasma to avoid film formation and etching of the substrate.

5. A method of manufacturing a semiconductor device comprising the steps of:

(a) irradiating a substrate having a surface, formed in part by at least one surface area of an exposed portion of a layer of hydrophilic, thermally oxidized silicon, with a high frequency nitrogen plasma at from 250° to 400° C. for about 1 to 60 minutes, whereby the hydrophilic thermally oxidized silicon in the surface area is converted from hydrophilic $SiO_2$ to hydrophobic $SiO_2$; and (b) reacting an organic silane and ozone to provide on the converted surface a smooth CVD silicon oxide film.

6. A method of manufacturing a semiconductor device according to claim 5 further comprising regulating the amplitude of electric power forming the plasma to avoid film formation and etching of the substrate.

7. A method of manufacturing a semiconductor device comprising the steps of:

(a) providing a substrate having a surface, a portion of said surface being an exposed layer of hydrophilic thermally oxidized silicon;

(b) contacting the substrate surface with a high frequency plasma of a gas selected from the group consisting of $O_2$, Ar and He, to convert the exposed surface of said layer of thermally oxidized silicon from hydrophilic $SiO_2$ to hydrophobic $SiO_2$; and (c) reacting a gaseous mixture containing an organic silane and ozone to deposit an insulating film having a smooth surface over the substrate surface by CVD.

8. A method of manufacturing a semiconductor device according to claim 7, wherein the substrate comprises the thermally oxidized silicon on a silicon layer and a discontinuous layer of poly-Si partially covering the surface of thermally oxidized silicon.

9. A method of manufacturing a semiconductor device according to claim 7 further comprising regulating the amplitude of electric power forming the plasma to avoid film formation and etching of the substrate.

* * * * *